(12) United States Patent
Tseng (10) Patent No.: US 11,686,776 B2
(45) Date of Patent: Jun. 27, 2023

(54) PREDICTION METHOD AND APPARATUS OF BATTERY HEALTH, AND STORAGE MEDIUM

(71) Applicant: Beijing Xiaomi Mobile Software Co., Ltd., Beijing (CN)

(72) Inventor: Yaoyi Tseng, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/564,675

(22) Filed: Dec. 29, 2021

(65) Prior Publication Data
US 2022/0381844 A1    Dec. 1, 2022

(30) Foreign Application Priority Data

May 31, 2021    (CN) .......................... 202110604832.4

(51) Int. Cl.
| | | |
|---|---|---|
| G01R 31/392 | (2019.01) | |
| G01R 31/389 | (2019.01) | |
| G01R 31/3842 | (2019.01) | |
| G01R 31/374 | (2019.01) | |
| H02J 7/00 | (2006.01) | |

(52) U.S. Cl.
CPC ......... *G01R 31/392* (2019.01); *G01R 31/374* (2019.01); *G01R 31/389* (2019.01); *G01R 31/3842* (2019.01); *H02J 7/005* (2020.01); *H02J 7/0048* (2020.01)

(58) Field of Classification Search
None
See application file for complete search history.

(56) References Cited

U.S. PATENT DOCUMENTS

| | | | |
|---|---|---|---|
| 2011/0307202 A1* | 12/2011 | Benjamin | ........ G01R 19/16542 |
| | | | 702/63 |
| 2013/0346001 A1 | 12/2013 | Park et al. | |
| 2017/0205468 A1* | 7/2017 | Park | ..................... G01R 31/374 |
| 2020/0049774 A1 | 2/2020 | Gao et al. | |

(Continued)

FOREIGN PATENT DOCUMENTS

WO    2020/115761 A1    6/2020

OTHER PUBLICATIONS

Mihai Victor Micea et al: "Online State-of-Health Assessment for Battery Management Systems", IEEE Transactions on Instrumentation Andmeasurement, IEEE, USA, vol. 60, No. 6, Jun. 1, 2011 (Jun. 1, 2011),pp. 1997-2006, XP011321730, ISSN: 0018-9456, DOI:10.1109/TIM.2011.2115630.

(Continued)

*Primary Examiner* — Jas A Sanghera
(74) *Attorney, Agent, or Firm* — Volpe Koenig (57) ABSTRACT

A prediction method of battery health includes: obtaining an environment temperature, and a discharge capacity and an operating parameter of a battery; determining an estimated operating parameter in a preset temperature at the discharge capacity according to the environment temperature, the discharge capacity and the operating parameter; determining an estimated capacity of the battery according to the estimated operating parameter; and determining a health level of the battery according to the estimated capacity of the battery and a reference capacity, at the discharge capacity of the battery.

20 Claims, 8 Drawing Sheets

(56) References Cited

U.S. PATENT DOCUMENTS

2021/0178928 A1* 6/2021 Ruppert .................. B60L 3/12

OTHER PUBLICATIONS

Lyu Zhiqiang et al: "Li-Ion Battery State of Health Estimation and Remaining Useful Life Prediction Through a Model-Data-Fusion Method" ,IEEE Transactions on Power Electronics,Institute of Electrical and Electronicsengineers, USA, vol. 36, No. 6,Oct. 23, 2020 (Oct. 23, 2020), pp. 6228-6240, XP011836138, ISSN: 0885-8993, DOI:10.1109/TPEL.2020.3033297.
Extended European Search Report dated Jul. 13, 2022 for European Patent Application No. 21218092.1.

* cited by examiner

PREDICTION METHOD AND APPARATUS OF BATTERY HEALTH, AND STORAGE MEDIUM

CROSS REFERENCE TO RELATED APPLICATIONS

The present application is based on and claims priority to the Chinese Patent Application No. 2021106048324, filed on May 31, 2021, the entire contents of which are incorporated herein by reference.

BACKGROUND

With development of an intelligent device such as a terminal device, it is one of the key concerns of a user to know battery health of the intelligent device in real time. A discharge capacity of a battery is susceptible to an environment temperature, a user service load, etc. and gets even more susceptible to the environment temperature, the load, etc. after the battery has aged, and consequently, it is difficult for the terminal device to obtain and display accurate battery health.

SUMMARY

In view of this, the disclosure provides a prediction method and apparatus of battery health, and a storage medium.

According to a first aspect, an example of the disclosure provides a prediction method of battery health, applied to a terminal device and including:

obtaining an environment temperature, and a discharge capacity and an operating parameter of a battery;

determining an estimated operating parameter in a preset temperature at the discharge capacity according to the environment temperature, the discharge capacity and the operating parameter;

determining an estimated capacity of the battery at the discharge capacity according to the estimated operating parameter; and determining a health level of the battery according to the estimated capacity of the battery and a reference capacity, at the discharge capacity, of the battery.

According to a second aspect, an example of the disclosure provides a prediction apparatus of battery health, including:

a processor; and a memory, configured to store an instruction executable by the processor.

The processor is configured to execute a prediction method of battery health, and the prediction method includes:

obtaining an environment temperature, and a discharge capacity and an operating parameter of a battery;

determining an estimated operating parameter in a preset temperature at the discharge capacity according to the environment temperature, the discharge capacity and the operating parameter;

determining an estimated capacity of the battery at the discharge capacity according to the estimated operating parameter; and determining a health level of the battery according to the estimated capacity of the battery and a reference capacity, at the discharge capacity, of the battery.

According to a third aspect, an example of the disclosure provides a non-temporary computer readable storage medium. The computer readable storage medium stores an instruction, and when the instruction is called and executed on a computer, a terminal may execute a prediction method of battery health, and the method includes:

obtaining an environment temperature, and a discharge capacity and an operating parameter of a battery;

determining an estimated operating parameter in a preset temperature at the discharge capacity according to the environment temperature, the discharge capacity and the operating parameter;

determining an estimated capacity of the battery at the discharge capacity according to the estimated operating parameter; and determining a health level of the battery according to the estimated capacity of the battery and a reference capacity, at the discharge capacity, of the battery.

It should be understood that the above general description and the following detailed description are only exemplary and explanatory rather than intend to limit the disclosure.

BRIEF DESCRIPTION OF THE DRAWINGS

Accompanying drawings here, which are incorporated in and constitute a part of this specification, illustrate examples consistent with the disclosure and, together with the specification, serve to explain principles of the disclosure.

DETAILED DESCRIPTION

Some examples will be described here in detail and their instances are shown in the drawings. When the following description concerning the drawings, unless otherwise stated, the same reference numbers in the different drawings represent the same or similar elements. Implementations described in the following examples do not represent all implementations consistent with the examples of the disclosure. Rather, they are only instances of an apparatus and a method described in the appended claims in detail and consistent with some aspects of the examples of the disclosure.

Figure 1:
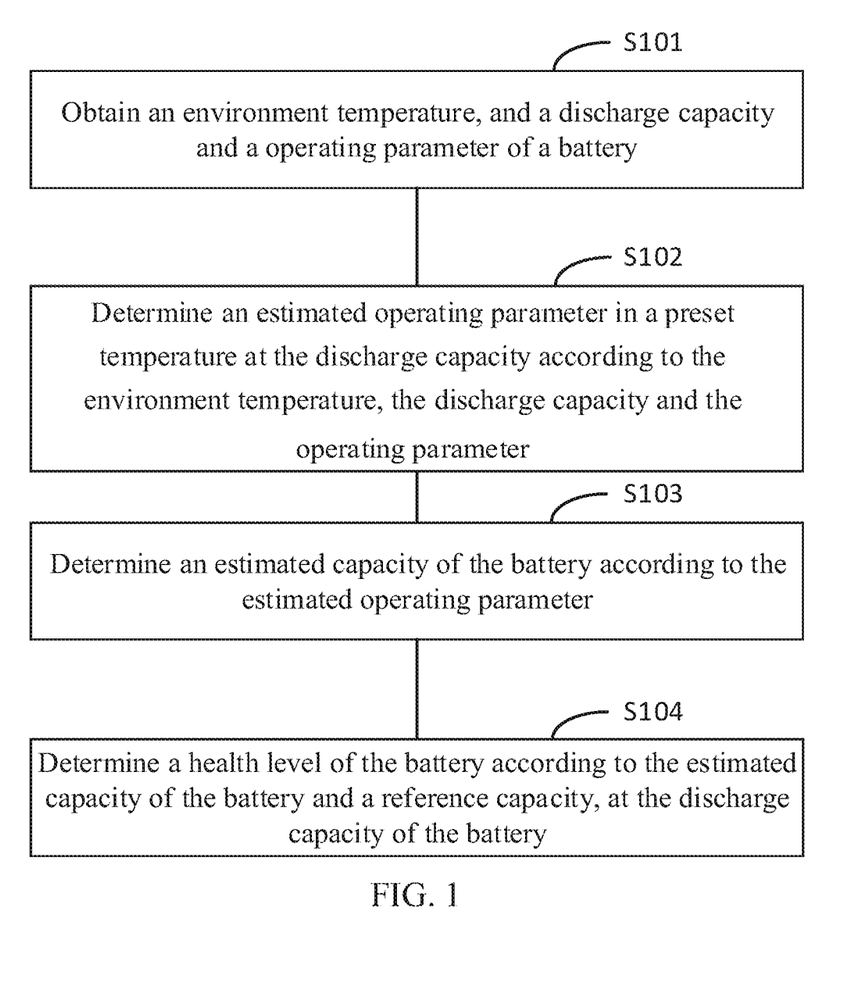
FIG. 1 illustrates a flowchart of a prediction method of battery health according to an example.

An example of the disclosure provides a prediction method of battery health, applied to a terminal device, as shown in FIG. 1, which illustrates a flowchart of a prediction method of battery health according to an example.

Step S101: an environment temperature, and a discharge capacity and an operating parameter of a battery are obtained.

Step S102: an estimated operating parameter in a preset temperature at the discharge capacity is determined according to the environment temperature, the discharge capacity and the operating parameter.

Step S103: an estimated capacity of the battery at the discharge capacity is determined according to the estimated operating parameter.

Step S104: a health level of the battery is determined according to the estimated capacity of the battery and a reference capacity, at the discharge capacity, of the battery.

In the prediction method of the battery health provided by the disclosure, given that the discharge capacity of the battery may be affected by the environment temperature, the battery health is predicted according to the operating parameter of the battery. The operating parameter of the battery includes self-operating parameters of the battery, for example, a resistance, a voltage or a current, etc. The estimated operating parameter in the preset temperature at the discharge capacity is determined according to the environment temperature and the discharge capacity and operating parameter of the battery obtained by the terminal device, then the estimated capacity of the battery at the discharge capacity is determined according to the estimated operating parameter, and thus, the health level of the battery is determined according to the estimated capacity and a reference capacity. The preset temperature may be a regular operating temperature of the battery, for example, a normal temperature of 25° C. The reference capacity of the battery may be a battery capacity of the battery under the discharge capacity before the battery is aged, for example, in initial use.

In the prediction method of the battery health provided by the disclosure, an influence of a temperature on the discharge capacity of the battery is considered, for example, a discharge capacity of the battery in a low temperature or a high temperature is different from that of the battery in a normal temperature. Prediction of the battery health should be performed under a normal temperature run environment rather than be affected by a current run environment of the terminal device. For example, a battery of the terminal device is large in power consumption under a low-temperature temperature, which does not mean that the battery health is poor. The battery is affected by the environment temperature, so the discharge capacity and the operating parameter under the environment temperature cannot serve as the basis of prediction of the battery health, the estimated operating parameter in the preset temperature (for example, the environment temperature) needs to be predicted according to the discharge capacity and the operating parameter in the environment temperature, then the estimated capacity in the preset temperature is determined, then the battery health is determined according to the estimated capacity and the reference capacity of the battery, for example, the health level of the battery, and thus, predication accuracy of the health level of the battery is improved.

By means of the method provided by the disclosure, the estimated capacity of the battery in the preset temperature can be determined according to the environment temperature, and the discharge capacity and operating parameter of the battery, and the health level of the battery is predicted according to the estimated capacity and the reference capacity, so that the health level of the battery could be obtained accurately, and the user can know the battery health more visually. The environment temperature is the temperature of the environment where the battery is located in the terminal device. For example, the environment temperature may be the temperature of the battery surface or the temperature of the mainboard of the terminal device. Furthermore, the temperature of the battery surface can be obtained by NTC installed on the battery surface of the terminal device, and the temperature of the mainboard of the terminal device can be obtained by a temperature sensor installed on the mainboard surface. The discharge capacity is the capacity value of the battery output measured under specified conditions.

In the prediction method of the battery provided by the disclosure, the health level of the battery may be predicted in a discharge cycle of the battery according to the discharge capacity, the operating parameter and the environment temperature. Alternatively, the health level of the battery may be determined depending on a preset rule according to health levels, determined in a plurality of discharge cycles, of the battery, for example, an average value of the health levels, determined in the plurality of discharge cycles, of the battery is used as a finally predicted health level of the battery.

Figure 2:
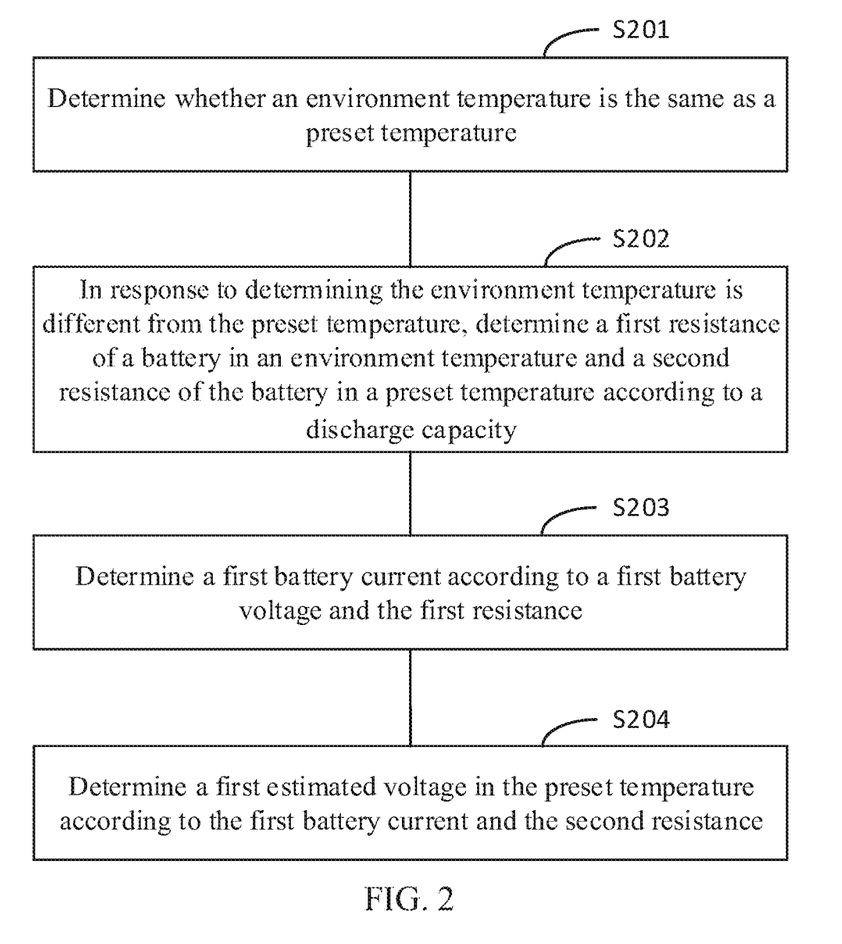
FIG. 2 illustrates a flowchart of step S102 of determining an estimated operating parameter in a preset temperature during a discharge capacity according to an environment temperature, the discharge capacity and an operating parameter in the method of FIG. 1.

In the prediction method of the battery health provided in the example of the disclosure, the operating parameter includes a first battery voltage, as shown in FIG. 2, which illustrates a flowchart of step S102 of determining an estimated operating parameter in a preset temperature during a discharge capacity according to an environment temperature, the discharge capacity and an operating parameter in the method of FIG. 1.

Step 201: whether the environment temperature is the same as the preset temperature is determined.

Step 202: in response to determining the environment temperature is different from the preset temperature, a first resistance of the battery in the environment temperature and a second resistance of the battery in the preset temperature are determined according to the discharge capacity.

Step 203: a first battery current is determined according to the first battery voltage and the first resistance.

Step 204: a first estimated voltage in the preset temperature is determined according to the first battery current and the second resistance.

In the prediction method of the battery health provided by the disclosure, the estimated operating parameter in the preset temperature at the discharge capacity can be determined according to the environment temperature, the discharge capacity and the operating parameter.

Figure 3:
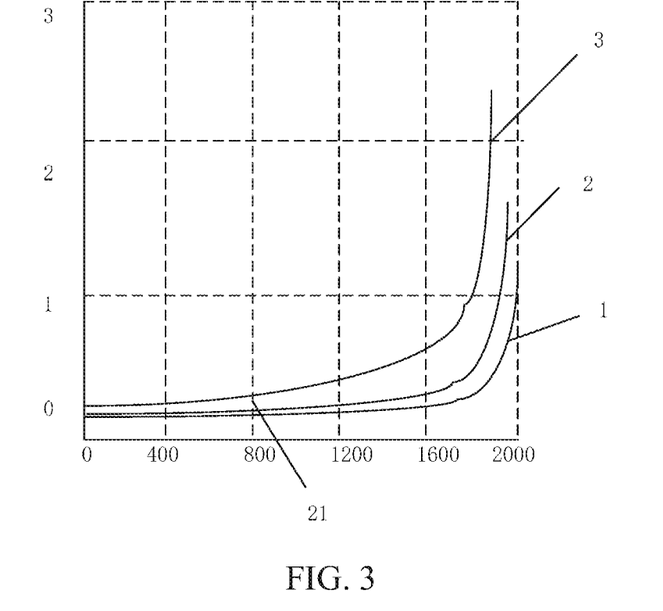
FIG. 3 illustrates a diagram of a correspondence between a resistance and a discharge capacity of a battery and an environment temperature.

In view of the influence of the environment temperature on the resistance of the battery, the resistance of the battery may be measured according to the discharge capacity of the battery and the environment temperature, and then a correspondence between the resistance and the discharge capacity of the battery and the environment temperature is determined. As show in FIG. 3, which illustrates a diagram of a correspondence between a resistance and a discharge capacity of a battery and an environment temperature, a transverse axis is the discharge capacity of the battery with a unit being milliampere-hour (mAh), and a longitudinal axis is the resistance with a unit being ohm ($\Omega$). FIG. 3 respectively shows resistance values of the battery in different discharge capacities in 0° C., 25° C. and 50° C., a line with its reference number being 1 represents resistance values of the battery in the different discharge capacities when the environment temperature is 50° C. A line with its reference number being 2 represents resistance values of the battery in the different discharge capacities when the environment temperature is 25° C. A line with its reference number being 3 represents resistance values of the battery in the different discharge capacities when the environment temperature is 0° C.

When the environment temperature is different from the preset temperature, the first resistance of the battery in the environment temperature and the second resistance of the battery in the preset temperature may be determined depending on the discharge capacities according to the correspondence between the resistance and the discharge capacity of the battery and the environment temperature in FIG. 3. For example, a current environment temperature is 0° C., the preset temperature is set to be 25° C., the discharge capacity is 800 mAh, and the first resistance in 0° C. is $R_0$. The second resistance of the battery in 25° C. may be determined to be $R_{25}$ according to the correspondence between the resistance and the discharge capacity of the battery and the environment temperature shown in FIG. 3. As shown in FIG. 3, when the discharge capacity is 800 mAh, a difference between the resistance in 0° C. and the resistance in 25° C. is $R_0$-$R_{25}$, as shown by reference number 21.

Figure 4:
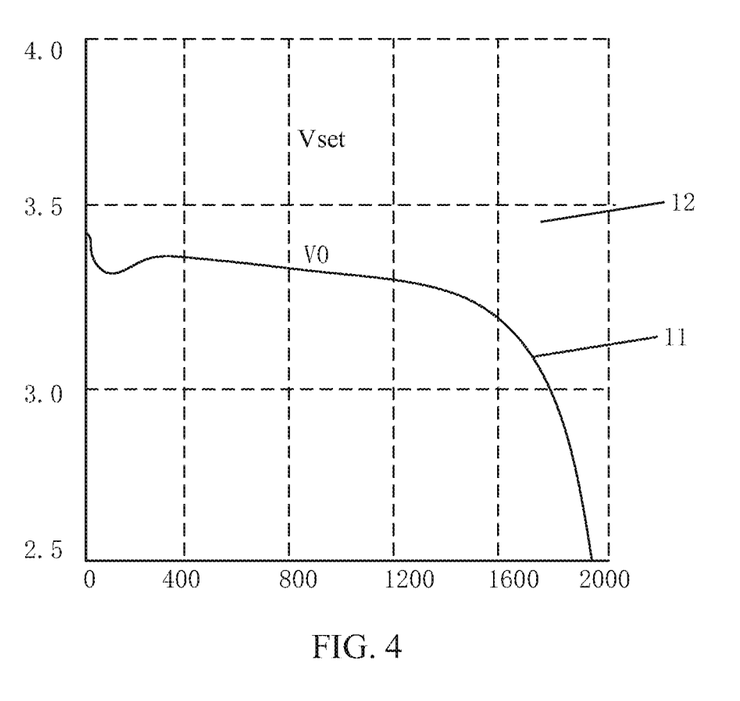
FIG. 4 illustrates a schematic diagram of a relation between a discharge capacity and a voltage of the battery in an environment temperature of 0° C.

The obtained operating parameter includes the first battery voltage, namely $V_0$. As shown in FIG. 4, which illustrates a schematic diagram of a relation between a discharge capacity and a voltage of the battery in an environment temperature of 0° C., when the discharge capacity is 800 mAh, the first battery voltage is $V_0$, as shown by reference number 11 in FIG. 4. According to the correspondence between the resistance and the discharge capacity of the battery and the environment temperature in FIG. 3, when the discharge capacity is 800 mAh, the first resistance in 0° C. is $R_0$, and then the first battery current may be determined to be $I_0=V_0/R_0$.

After the first battery current of the battery in the discharge capacity of 800 mAh is obtained, a first estimated voltage $V_{set}$ of the battery in the set temperature of 25° C. may be solved according to the second battery resistance $R_{25}$ in the set temperature of 25° C. or the difference $R_0$-$R_{25}$ between the resistance in 0° C. and the resistance in 25° C., as shown by a curve with its reference number being 12 in FIG. 4, the first estimated voltage in the discharge capacity of 800 mAh is $V_{set}$. $V_{set}$ is equal to a product of multiplying $I_0$ (the current of the battery in the discharge capacity of 800 mAh) by $R_{25}$ (the resistance in the set temperature) or equal to a product of multiplying $I_0$ (the current of the battery in the discharge capacity of 800 mAh) by $R_0$-$R_{25}$ (the difference between the resistance in the environment temperature and the resistance in the set temperature) plus $V_0$ (the first battery voltage in the environment temperature), namely, $V_{set}=I_0*R_{25}$ or $V_{set}=I_0*(R_0-R_{25})+V_0$.

After the first estimated voltage is determined, the estimated capacity of the battery in the discharge capacity may be determined according to the first estimated voltage, and then the health level of the battery is determined.

In the example provided by the disclosure, an estimated battery voltage, namely, the first estimated voltage, in the preset temperature at the discharge capacity is inferred according to the operating parameter, namely, the first battery voltage, of the battery, the estimated capacity of the battery is determined, and then the health level of the battery is determined. The regular operating temperature of the battery and the estimated voltage of the battery in the set temperature may be determined according to the environment temperature, the estimated capacity of the battery in the regular operating temperature is determined, then the health level of the battery is determined, and thus prediction of the health level of the battery is more reasonable and more accurate.

In the prediction method of the battery health provided by the example of the disclosure, determining the estimated capacity of the battery according to the estimated operating parameter includes:

a first estimated capacity of the battery is determined according to the first estimated voltage and a reference voltage in the set temperature.

In the prediction method of the battery health provided by the disclosure, the first estimated capacity of the battery is determined according to the first estimated voltage and the reference voltage in the set temperature. The reference voltage in the set temperature may be a battery voltage in the set temperature when the discharge capacity is 800 mAh before the battery is aged, for example, in initial use. After the first estimated voltage is known, the first estimated capacity may be determined according to a relation between the voltage and a capacity of the battery.

The relation between the voltage and the capacity of the battery may include:

A ratio of the first estimated voltage to the reference voltage in the set temperature is in positive correlation with a ratio of the first estimated capacity of the battery to the reference capacity of the battery. For example, the ratio of the first estimated voltage of the battery in the set temperature in the discharge capacity of, for example, 800 mAh to the reference voltage in the set temperature is in positive correlation with the ratio of the first estimated capacity of the battery to the reference capacity of the battery.

The ratio of the first estimated voltage of the battery to the reference voltage in the set temperature is in positive correlation with the ratio of the first estimated capacity of the battery to the reference capacity of the battery. For example, the first estimated voltage of the battery is A1, the reference voltage in the set temperature is A2, the first estimated capacity is B1, the reference capacity is B2, and thus a relation between them is a formula: $A1/A2=k*(B1/B2)$, in which k is any positive number. Accordingly, in the example provided by the disclosure, the first estimated capacity of the battery may be determined through the formula.

In the prediction method of the battery health provided by the disclosure, the first estimated capacity of the battery is determined through a relation between the first estimated voltage and the reference voltage in the set temperature, the first estimated capacity of the battery is obtained more accurately, thus the battery health may be worked out accurately, and user experience is improved.

In the prediction method of the battery health provided by the example of the disclosure, in response to determining the environment temperature is the same as the preset temperature, the first estimated voltage is determined to be equal to the first battery voltage.

In the prediction method of the battery health provided by the disclosure, if the current environment temperature is the same as the preset temperature, the first estimated voltage is equal to the first battery voltage. For example, the current environment temperature is 25° C., the preset temperature is 25° C., the current environment temperature is the same as the preset temperature, corresponding operating parameters are also the same, and thus the first battery voltage in the current environment temperature may be directly used as the first estimated voltage.

In the prediction method of the battery health provided by the disclosure, when the environment temperature is the same as the preset temperature, the first estimated voltage is equal to the first battery voltage, a complex calculation process is omitted, calculation pressure of the terminal device is relieved, and accurate displaying of the battery health can be guaranteed most efficiently.

Figure 5:
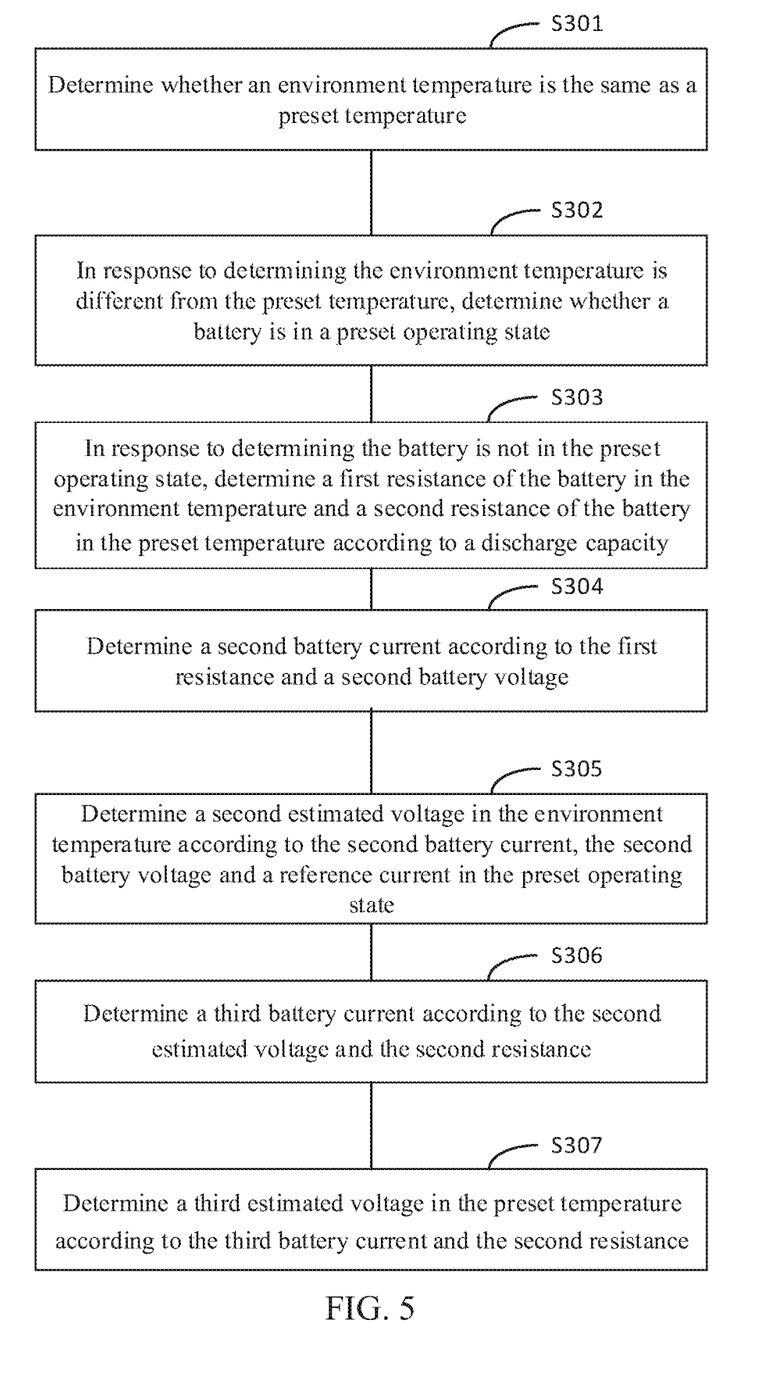
FIG. 5 illustrates a flowchart of step S102 of determining an estimated operating parameter in a preset temperature during a discharge capacity according to an environment temperature, the discharge capacity and an operating parameter in the method of FIG. 1.

In the prediction method of the battery health provided by the example of the disclosure, the operating parameter includes a second battery voltage, as shown in FIG. 5, which illustrates a flowchart of step S102 of determining an estimated operating parameter in a preset temperature during a discharge capacity according to an environment temperature, the discharge capacity and an operating parameter in the method of FIG. 1.

Step 301: whether the environment temperature is the same as the preset temperature is determined.

Step 302: in response to determining the environment temperature is different from the preset temperature, whether the battery is in a preset operating state is determined.

Step 303: in response to determining the battery is not in the preset operating state, a third resistance of the battery in the environment temperature and a fourth resistance of the battery in the preset temperature is determined according to the discharge capacity.

Step 304: a second battery current is determined according to the third resistance and the second battery voltage.

Step 305: a second estimated voltage in the environment temperature is determined according to the second battery current, the second battery voltage and a reference current in the preset operating state.

Step 306: a third battery current is determined according to the second estimated voltage and the fourth resistance.

Step 307: a third estimated voltage in the preset temperature is determined according to the third battery current and the fourth resistance.

In the prediction method of the battery health provided by the disclosure, in view of the environment temperature, a load of the terminal device is also considered, and thus prediction accuracy of the battery health is further improved. The preset operating state means that the battery is in a regular operating state, for example, a light-load operating state, that is, an application operating in the terminal device includes a communication application and the like which consumes power normally. When the terminal device is loaded, for example, in a state of playing a game or in a heavy-load operating state, for example, an operating state such as turning on a flash, it is a non-regular operating state.

In the example provided by the disclosure, when it is determined that the current environment temperature is different from the preset temperature and the battery is not in the preset operating state, the second estimated voltage in the set temperature is determined according to the third resistance in the current environment temperature, the second battery voltage and the fourth resistance in the preset temperature. Then the third battery current is determined according to the second estimated voltage and the fourth resistance, and the third estimated voltage in the preset operating state in the preset temperature is determined according to the third battery current, the fourth resistance and the reference current in the preset operating state.

In view of the influence of the environment temperature on the resistance of the battery, whether the environment temperature is the same as the set temperature is determined, and if not, whether the battery is in the preset operating state is determined. When an operating state of the battery is different from the preset operating state, the third resistance of the battery in the environment temperature and the fourth resistance of the battery in the preset temperature are determined according to the discharge capacity. The operating state of the battery is different from the preset state, the operating state of the battery may be set to be a loaded state of the terminal device, for example, a state of playing a game of the terminal device.

As described above and as shown in FIG. 3, which illustrates a diagram of a correspondence between a resistance and a discharge capacity of a battery and an environment temperature. The transverse axis is the discharge capacity of the battery with the unit being milliampere-hour (mAh), and the longitudinal axis is the resistance with the unit being ohm (a). Due to the influence of the environment temperature on the resistance of the battery, the resistance of the battery may be measured according to the discharge capacity of the battery and the environment temperature, and then the influence of the resistance and the discharge capacity of the battery and the environment temperature is determined. FIG. 3 respectively illustrates the resistance values of the battery in the different discharge capacities in 0° C., 25° C. and 50° C., the line with its reference number being 1 represents the resistance values of the battery in the different capacities when the environment temperature is 50° C., the line with its reference number being 2 represents the resistance values of the battery in the different capacities when the environment temperature is 25° C., and the line with its reference number being 3 represents the resistance values of the battery in the different discharge capacities when the environment temperature is 0° C.

When the environment temperature is different from the preset temperature, the third resistance of the battery in the environment temperature and the fourth resistance of the battery in the preset temperature may be determined according to the correspondence between the resistance and the discharge capacity of the battery and the environment temperature in FIG. 3 and according to the discharge capacities. For example, the current environment temperature is 0° C., the preset temperature is set to be 25° C., the discharge capacity is 800 mAh, the third resistance in 0° C. is the same as the first resistance and is $R_0$. According to the correspondence between the resistance and the discharge capacity of the battery and the environment temperature shown in FIG. 3, the fourth resistance of the battery in 25° C. is determined, which is the same as the second resistance and is $R_{25}$. As shown in FIG. 3, when the discharge capacity is 800 mAh, a difference between the resistance in 0° C. and the resistance in 25° C. is $R_0 - R_{25}$, as shown by reference number 21.

After the third resistance and the fourth resistance are determined, the second battery current is determined according to the third resistance and the second battery voltage.

Figure 6:
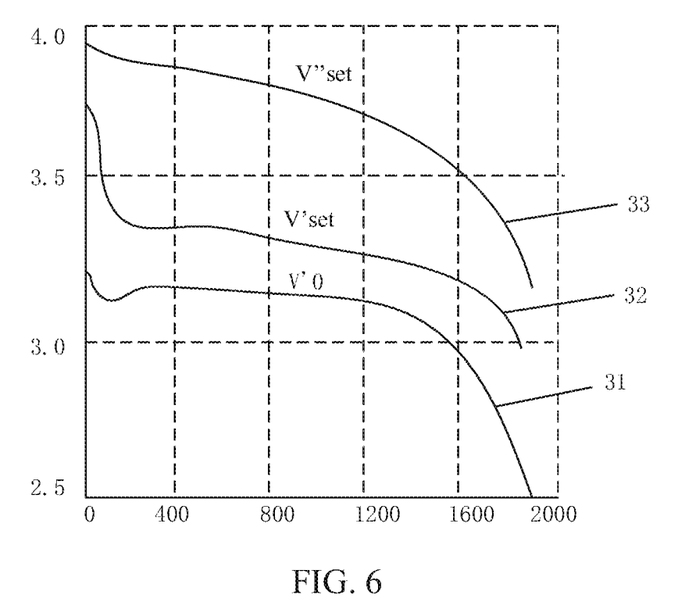
FIG. 6 illustrates a schematic diagram of a relation between a discharge capacity and a voltage of a battery in an environment temperature of 0° C. under the condition of loading a terminal device.

The obtained operating parameter includes the second battery voltage which is $V'_0$. As shown in FIG. 6, which illustrates a schematic diagram of a relation between a discharge capacity and a voltage of a battery in an environment temperature of 0° C. under the condition of loading a terminal device. As shown by reference number 31 in FIG. 6, when the discharge capacity is 800 mAh, the second battery voltage is $V'_0$. In view of the load, the influence on the resistance of the battery is small, and thus the influence of only the temperature on the resistance may be considered. Accordingly, in a case of the load, the resistance values may be determined according to the correspondence between the resistance and the discharge capacity of the battery and the environment temperature in FIG. 3. For example, when the discharge capacity is 800 mAh, the third resistance in 0° C.

is $R_0$, it may be determined that the second battery current is $I'_0=V'_0/R_0$ in the discharge capacity of 800 mAh in the environment temperature of 0° C. in a case of the load.

After the second battery current roof the battery in the discharge capacity of 800 mAh in the environment temperature of 0° C. in the loaded state is obtained, the second estimated voltage $V'_{set}$ of the battery in the set temperature of 25° C. may be solved according to the fourth resistance $R_{25}$ of the battery in the set temperature of 25° C. or the difference $R_0-R_{25}$ between the resistance in 0° C. and the resistance in 25° C. As shown by a curve with its reference number being 32 in FIG. 6, the second estimated voltage in the discharge capacity of 800 mAh in the preset temperature of 25° C. in a case of the load is $V'_{set}$. $V'_{set}$ is equal to a product of multiplying $I'_0$ (the current of the battery in the discharge capacity of 800 mAh) by $R_{25}$ (the resistance in the set temperature) or equal to a product of multiplying $I'_0$ (the current of the battery in the discharge capacity of 800 mAh by $R_0-R_{25}$ (the different between the resistance in the environment temperature and the resistance in the set temperature) plus $V'_0$ (the second battery voltage in the environment temperature), namely, $V'_{set}=I'_0*R_{25}$, or $V'_{set}=I'_0*(R_0-R_{25})+V'_0$.

After the second estimated voltage is determined to be $V'_{set}$ in the discharge capacity of 800 mAh in the set temperature of 25° C. in a case of the load, the third current $I_3$ is determined according to the second estimated voltage $V'_{set}$ and the fourth resistance. The third current $I_3$ is equal to dividing the second estimated voltage $V'_{set}$ by the fourth resistance, namely, $I_3=V'_{set}/R_{25}$.

After the third current $I_3$ is determined, the third estimated voltage $V''_{set}$ in the preset temperature in the preset operating state is determined according to the third current, the fourth resistance and the reference current $I_{reference}$ in the preset operating state. The reference current in the preset operating state represents a discharge current of the battery in the regular operating state in the regular temperature. Under the condition that a model number of the battery is certain, the reference current $I_{reference}$ may be determined according to $R_{25}$. The third estimated voltage $V''_{set}$ is equal to a product of multiplying $I_3-I_{reference}$ (a difference between the third current $I_3$ and the reference current $I_{reference}$) by the fourth resistance $R_{25}$, namely, $V''_{set}=(I_3-I_{reference})*R_{25}$.

After the third estimated voltage is determined, the estimated capacity of the battery at the discharge capacity may be determined according to the third estimated voltage, and then the health level of the battery is determined.

In the example provided by the disclosure, in view of the environment temperature, the load of the terminal device is considered at the same time, when it is determined that the current environment temperature is different from the preset temperature and the battery is not in the preset operating state, the second estimated voltage in the set temperature is determined according to the third resistance in the current environment temperature, the second battery voltage and the fourth resistance in the preset temperature. The third battery current is determined according to the second estimated voltage and the fourth resistance, and the third estimated voltage in the preset operating state in the preset temperature is determined according to the third battery current, the fourth resistance and the reference current in the preset operating state. An estimated capacitance in the preset operating state in the regular operating temperature of the battery is determined, then the health level of the battery is determined, and thus prediction of the health level of the battery is more reasonable and more accurate.

In the prediction method of the battery health provided by the example of the disclosure, the determining the estimated capacity of the battery according to the estimated operating parameter includes:

the second estimated capacity of the battery is determined according to the third estimated voltage and a reference voltage in the preset operating state in the set temperature. The reference voltage in the preset operating state in the set temperature may be a battery voltage in the preset operating state in the discharge capacity of, for example, 800 mAh in the set temperature before the battery is aged, for example, in initial use. After the third estimated voltage is known, the second estimated capacity may be determined according to the relation between the voltage and the capacity of the battery.

The relation between the voltage and the capacity of the battery may include:

a ratio of the third estimated voltage to the reference voltage in the preset operating state in the set temperature is in positive correlation with a ratio of the second estimated capacity of the battery to the reference capacity of the battery. For example, the ratio of the third estimated voltage of the battery in the preset operating state in the discharge capacity of, for example, 800 mAh in the set temperature to the reference voltage in the preset operating state in the set temperature is in positive correlation with the ratio of the second estimated capacity of the battery to the reference capacity of the battery.

The ratio of the third estimated voltage of the battery to the reference voltage in the set temperature in a preset run environment is in positive correlation with the ratio of the second estimated capacity of the battery to the reference capacity of the battery. For example, the third estimated voltage of the battery is C1, the reference voltage in the set temperature in the preset run environment is C2, the second estimated capacity is D1, the reference capacity is D2, and thus a relation between them is a formula: C1/C2=n*(D1/D2), in which n is any positive number. In the example provided by the disclosure, the second estimated capacity of the battery may be determined through the formula.

In the example provided by the disclosure, by means of the positive correlation between the ratio of the third estimated voltage to the reference voltage in the preset operating state in the set temperature and the ratio of the second estimated capacity of the battery to the reference capacity of the battery, the second estimated capacity of the battery can be obtained more accurately, the battery health can be determined, and the user experience can be improved.

In the prediction method of the battery health provided by the example of the disclosure, in response to determining the environment temperature is the same as the preset temperature, the second estimated voltage is determined to be equal to the second battery voltage.

In the example provided by the disclosure, if the current environment temperature is the same as the preset temperature, namely, the battery is in the preset temperature at present, thus the second estimated voltage is equal to the second battery voltage. In the example provided by the disclosure, the complex calculation process is omitted, the calculation pressure of the terminal device is relieved, and accurate displaying of the battery health can be guaranteed most efficiently.

In the prediction method of the battery health provided by the example of the disclosure, the determining the health level of the battery according to the estimated capacity of the battery and the reference capacity, at the discharge capacity, of the battery includes:

service time of the battery is obtained, and the health level of the battery is determined according to its service time, its estimated capacity and its reference capacity at the discharge capacity.

Figure 7:
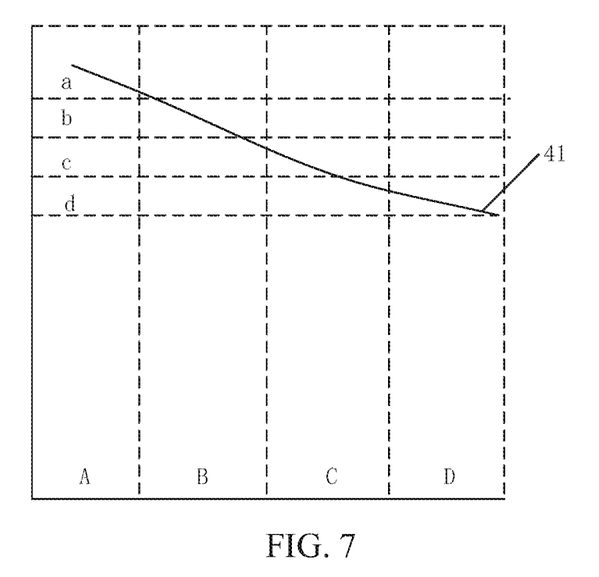
FIG. 7 illustrates a curve chart of a health level of a battery.

In the prediction method of the battery health provided by the disclosure, the health level of the battery may be predicted with reference to the service time, and the health level of the battery may be further determined according to its service time, its estimated capacity and its reference capacity at the discharge capacity. In the method provided by the disclosure, after the estimated capacity in the discharge capacity is determined, a preliminary health level is determined in contrast to the reference capacity of the battery, and then the health level of the battery is finally determined with reference to the service time of the battery. For example, when the estimated capacity of the battery is larger than or equal to 95% of the reference capacity of the battery, it may be believed that the health level of the battery is excellent; when the estimated capacity of the battery is larger than or equal to 90% of the reference capacity of the battery, it may be considered that the health level of the battery is good; when the estimated capacity of the battery is larger than or equal to 85% of the reference capacity of the battery, it may be accepted that the health level of the battery is normal; and when the estimated capacity of the battery is larger than or equal to 80% of the reference capacity of the battery, it may be sure that the health level of the battery is ordinary. As shown in FIG. 7, a curve 41 in FIG. 7 shows a curve chart of a health level of a battery, in which a longitudinal axis is a capacity of the battery.

In the prediction method of the battery health provided by the disclosure, the service time of the battery is used as a prediction reference parameter of the health level of the battery. As shown in FIG. 7, a transverse axis is the service time, and it may be divided according to the number of times of charging and discharging, for example, if a life cycle of the battery is 800 times of charging and discharging, the cycle may be divided every 200 times as a level. A is a charging-discharging cycle of 0-200 times, B is a charging-discharging cycle of 201-400 times, C is a charging-discharging cycle of 401-600 times, and D is a charging-discharging cycle of 601-800 times. The service time of the battery is referred to while the estimated capacity of the battery is referred to. For example, if the estimated capacity of the battery is 94% of the reference capacity of the battery, its health level is normal without considering the service time. In view of the service time, the service time of the battery is 400 times of charging and discharging, the capacity of the battery is supposed to be 90% of the reference capacity of the battery after the battery is charged and discharged for 400 times in the regular operating state in the regular temperature, however, the estimated capacity of the battery is 94%, far higher than 90%, of the reference capacity of the battery, and it is not reasonable obviously if a prediction result of the service time being 400 times of charging and discharging and the estimated capacity of the battery being 94% of the reference capacity of the battery is simply regarded as normal. In order to make prediction of the battery health more reasonable, the health level of the battery may be determined finally according to a preset rule in view of the service time, the estimated capacity of the battery and the reference capacity, at the discharge capacity, of the battery at the same time. For example, a capacity of the battery is obtained after multiplying m % (which a capacity of the battery after the battery is charged and discharged for N times in the regular operating state in the regular temperature accounts for of the reference capacity of the battery) by a preset coefficient and then compared with the estimated capacity of the battery, if the estimated capacity of the battery is larger than the capacity (obtained after multiplying by the preset coefficient) of the battery, the health level of the battery is up-regulated by one level, for example, if the preset coefficient is 0.99-1.01, the health level of the battery with the service time being 400 times of charting and discharging and the estimated capacity of the battery being 94% of the reference capacity of the battery is supposed to be excellent. If the estimated capacity of the battery is smaller than the capacity (obtained after multiplying by the preset coefficient) of the battery, the health level of the battery is down-regulated by one level, for example, if the preset coefficient is 1.01, the health level of the battery with the service time being 400 times of charging and discharging and the estimated capacity of the battery being 88% of the reference capacity of the battery is supposed to be ordinary.

In the example provided by the disclosure, the health level of the battery is determined according to its service time, its estimated capacity and its reference capacity at the discharge capacity, and prediction accuracy of the health level of the battery is improved.

In the prediction method of the battery health provided by the disclosure, the health level of the battery within a charging-discharging cycle is predicted. Health levels in a plurality of discharge capacities of the battery may be obtained within the charging-discharging cycle, and a prediction result of the health level of the battery after the charging-discharging cycle is determined according to a preset rule. For example, an average of the health levels in the plurality of discharge capacities of the battery is used as a finally predicted health level of the battery after the charging-discharging cycle.

The health level of the battery may be also determined depending on a preset rule according to health levels of the battery determined within a plurality of charging-discharging cycles, for example, an average of the health levels of the battery determined within the plurality of charging-discharging cycles is used as the finally predicted health level of the battery after the plurality of charging-discharging cycles.

In the example provided by the disclosure, the health level of the battery may be determined according to its service time, its estimated capacity and its reference capacity at the discharge capacity, the health level of the battery can be regulated in time after the battery is affected by the temperature and/or the load, thus, the user can know an operating condition of the battery in time, and the user experience is improved.

The prediction method of the battery health provided by the example of the disclosure further includes:

generating display information for the terminal device to display the determined health level of the battery.

Figure 8:
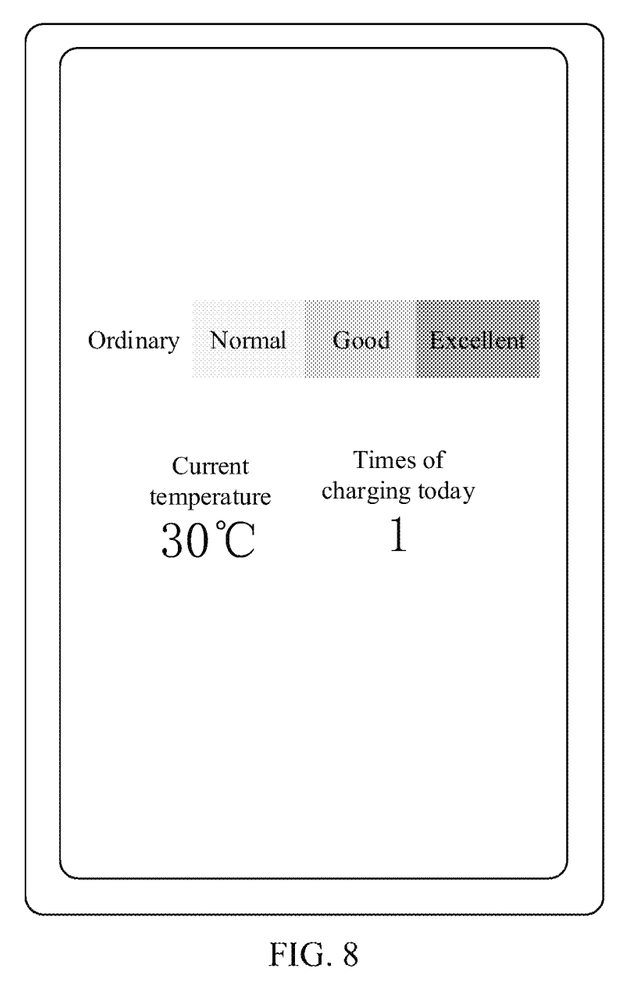
FIG. 8 illustrates a schematic diagram of displaying of a health level of a battery.

In the prediction method of the battery health provided by the disclosure, the determined health level of the battery is displayed on a corresponding interface of the terminal device, as shown in FIG. 8, which illustrates a schematic diagram of displaying of a health level of a battery. It may be displayed in four levels, namely, excellent, good, normal and ordinary. All the levels are displayed in different modes, for example, in different color depths.

In the prediction method of the battery health provided by the disclosure, the health level of the battery is displayed in modes shown in FIG. 8 so that the user can know the health level of the battery of the terminal device in real time, and the user experience can be improved.

Figure 9:
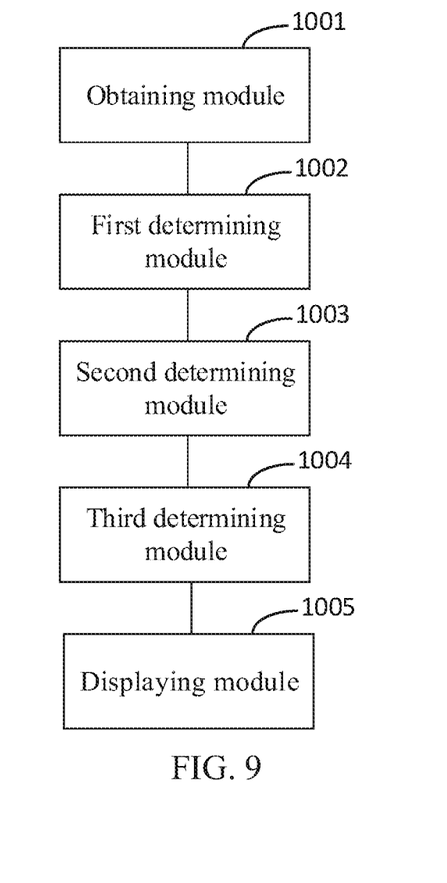
FIG. 9 illustrates a block diagram of a prediction apparatus of battery health according to an example.

An example of the disclosure further provides a prediction apparatus of the battery health, referring to FIG. 9, which illustrates a structural diagram of a prediction apparatus of battery health according to an example. As shown in FIG. 9, applied to a terminal device, the apparatus includes:

an obtaining module 1001, configured to obtain an environment temperature, and a discharge capacity and an operating parameter of a battery;

a first determining module 1002, configured to determine an estimated operating parameter in a preset temperature at the discharge capacity according to the environment temperature, the discharge capacity and the operating parameter;

a second determining module 1003, configured to determine an estimated capacity of the battery at the discharge capacity according to the estimated operating parameter; and a third determining module 1004, configured to determine a health level of the battery according to the estimated capacity of the battery and a reference capacity, at the discharge capacity, of the battery.

In the prediction apparatus of the battery health provided by the example of the disclosure, the operating parameter includes a first battery voltage.

The first determining module 1002 includes:

whether the environment temperature is the same as the preset temperature is determined;

in response to determining the environment temperature is different from the preset temperature, a first resistance of the battery in the environment temperature and a second resistance of the battery in the preset temperature are determined according to the discharge capacity;

a first battery current is determined according to the first battery voltage and the first resistance; and a first estimated voltage in the preset temperature is determined according to the first battery current and the second resistance.

In the prediction apparatus of the battery health provided by the example of the disclosure, in response to determining the environment temperature is the same as the preset temperature, the first estimated voltage is determined to be equal to the first battery voltage.

In the prediction apparatus of the battery health provided by the example of the disclosure, the second determining module 1003, includes:

a first estimated capacity of the battery is determined according to the first estimated voltage and a reference voltage in a set temperature.

In a prediction apparatus of the battery health provided by the example of the disclosure, the determining the first estimated capacity of the battery according to the first estimated voltage and the reference voltage in the set temperature includes:

a ratio of the first estimated voltage to the reference voltage in the set temperature is in positive correlation with a ratio of the first estimated capacity of the battery to the reference capacity of the battery.

In the prediction apparatus of the battery health provided by the example of the disclosure, the operating parameter includes a second battery voltage.

The first determining module 1002, includes:

whether the environment temperature is the same as the preset temperature is determined;

in response to determining the environment temperature is different from the preset temperature, whether the battery is in a preset operating state is determined;

in response to determining the battery is not in the preset operating state, the first resistance of the battery in the environment temperature and the second resistance of the battery in the preset temperature are determined according to the discharge capacity;

a second voltage current is determined according to the first resistance and the second battery voltage;

a second estimated voltage in the environment temperature is determined according to the second battery current, the second battery voltage and a reference current in the preset operating state;

a third battery current is determined according to the second estimated voltage and the second resistance; and a third estimated voltage in the preset temperature is determined according to the third battery current and the second resistance.

In the prediction apparatus of the battery health provided by the example of the disclosure, in response to determining the environment temperature is the same as the preset temperature, the third estimated voltage is determined to be equal to the second estimated voltage.

In the prediction apparatus of the battery health provided by the example of the disclosure, the second determining module 1003, includes:

a second estimated capacity of the battery is determined according to the third estimated voltage and the reference voltage in the set temperature.

In the prediction apparatus of the battery health provided by the example of the disclosure, the determining the second estimated capacity of the battery according to the third estimated voltage and the reference voltage in the set temperature includes:

a ratio of the third estimated voltage to the reference voltage in the set temperature is in positive correlation with a ratio of the second estimated capacity of the battery to the reference capacity of the battery.

In the prediction apparatus of the battery health provided by the example of the disclosure, the second determining module 1003, includes:

a resistance of the battery is measured according to the discharge capacity and the environment temperature, and a correspondence between the resistance and the discharge capacity of the battery and the environment temperature is determined.

In the prediction apparatus of the battery health provided by the example of the disclosure, the third determining module 1004, includes:

service time of the battery is obtained, and the health level of the battery is determined according to its service time, its estimated capacity and its reference capacity at the discharge capacity.

In the prediction apparatus of the battery health provided by the example of the disclosure, the prediction apparatus further includes:

a displaying module 1005, configured to generate display information for the terminal device to display the determined health level of the battery.

Figure 10:
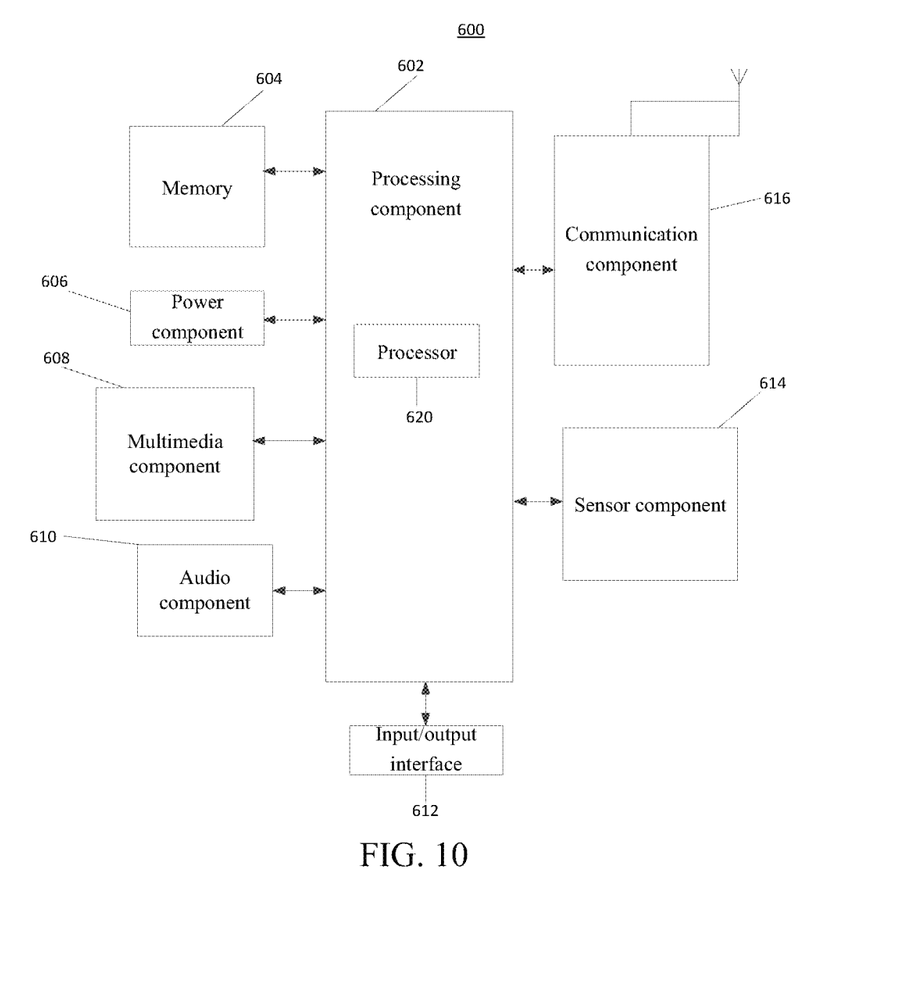
FIG. 10 illustrates a block diagram of a prediction apparatus 600 of battery health according to an example.

FIG. 10 illustrates a block diagram of a prediction apparatus 600 of battery health according to an example. For example, the apparatus 600 may be a mobile phone, a computer, a digital broadcast terminal, a messaging device, a game console, a tablet device, a medical device, a fitness facility, a personal digital assistant, etc.

Referring to FIG. 10, the apparatus 600 may include one or more components as follows: a processing component 602, a memory 604, a power component 606, a multimedia component 608, an audio component 610, an input/output (I/O) interface 612, a sensor component 614 and a communication component 616.

The processing component 602 generally controls whole operation of the apparatus 600, such as operations related to display, phone call, data communication, camera operation and recording operation. The processing component 602 may include one or more processors 620 for executing instructions so as to complete all or part of steps of the above method. Besides, the processing component 602 may include one or more modules to facilitate interaction between the processing component 602 and the other components. For example, the processing component 602 may include a multimedia module so as to facilitate interaction between the multimedia component 608 and the processing component 602.

The memory 604 is configured to store various data to support operations on the apparatus 600. Instances of these data include instructions of any application program or method for operation on the apparatus 600, contact person data, telephone directory data, messages, pictures, videos and the like. The memory 604 may be realized by any type of volatile or non-volatile storage device or their combination, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or a compact disc.

The power component 606 provides power for the various components of the apparatus 600. The power component 606 may include a power management system, one or more power sources, and other components related to power generation, management and distribution for the apparatus 600.

The multimedia component 608 includes a screen which provides an output interface between the apparatus 600 and a user. In some examples, the screen may include a liquid crystal display (LCD) and a touch panel (TP). If the screen includes the touch panel, the screen may be realized as a touch screen so as to receive an input signal from the user. The touch panel includes one or more touch sensors so as to sense touching, swiping and gestures on the touch panel. The touch sensor can not only sense a boundary of a touching or swiping action, but also detect duration and pressure related to touching or swiping operation. In some examples, the multimedia component 608 includes a front camera and/or a rear camera. When the apparatus 600 is in an operation mode, such as a photographing mode or a video mode, the front camera and/or the rear camera can receive external multimedia data. Each front camera and each rear camera may be a fixed optical lens system or have a focal length and an optical zoom capability.

The audio component 610 is configured to output and/or input an audio signal. For example, the audio component 610 includes a microphone (MIC). When the apparatus 600 is in the operation mode, such as a call mode, a recording mode and a voice recognition mode, the microphone is configured to receive an external audio signal. The received audio signal may be further stored in the memory 604 or sent through the communication component 616. In some examples, the audio component 610 further includes a loudspeaker for outputting the audio signal.

The I/O interface 612 provides an interface between the processing component 602 and a peripheral interface module, and the peripheral interface module may be a keyboard, a click wheel, buttons and the like. These buttons may include but are not limited to: a home button, a volume button, a start button and a lock button.

The sensor component 614 includes one or more sensors, configured to provide state evaluation of various aspects for the apparatus 600. For example, the sensor component 614 may detect a start/shut-down state of the apparatus 600 and relative positioning of the components, for example, the components are a display and a keypad of the apparatus 600. The sensor component 614 may further detect position change of the apparatus 600 or one component of the apparatus 600, whether there is contact between the user and the apparatus 600, and azimuth or speed up/speed down and temperature change of the apparatus 600. The sensor component 614 may include a proximity sensor, configured to detect existence of a nearby object without any physical contact. The sensor component 614 may further include an optical sensor, such as a CMOS or CCD image sensor, for use in imaging application. In some examples, the sensor component 614 may further include an acceleration sensor, a gyroscope sensor, a magnetic sensor, a pressure sensor or a temperature sensor.

The communication component 616 is configured to facilitate wired or wireless communication between the apparatus 600 and the other devices. The apparatus 600 may be accessed to a wireless network based on a communication standard, such as WiFi, 2G or 3G, or their combination. In an example, the communication component 616 receives a broadcast signal or related broadcast information from an external broadcast management system through a broadcast channel. In an example, the communication component 616 further includes a near-field communication (NFC) module so as to facilitate short-range communication. For example, the NFC module may be realized based on a radio frequency identification (RFID) technology, an infra-red data association (IrDA) technology, an ultra-wide band (UWB) technology, a Bluetooth (BT) technology and other technologies.

In an example, the apparatus 600 may be realized by one or more application specific integrated circuits (ASICs), digital signal processors (DSPs), digital signal processing devices (DSPDs), programmable logic devices (PLDs), field-programmable gate arrays (FPGAs), controllers, microcontrollers, microprocessors or other electronic elements for executing the above method.

An example further provides a non-temporary computer readable storage medium including instructions, such as a memory 604 including the instructions. The instructions may be executed by a processor 620 of an apparatus 600 so as to complete the above method. For example, the non-temporary computer readable storage medium may be an ROM, a random access memory (RAM), a CD-ROM, a magnetic tape, a floppy disk, an optical data storage device and the like.

A computer readable storage medium stores instructions. When the instructions are called and executed on a computer, a terminal can execute a prediction method of battery health, and the method includes:

an environment temperature, and a discharge capacity and an operating parameter of a battery are obtained;

an estimated operating parameter in a preset temperature at the discharge capacity is determined according to the environment temperature, the discharge capacity and the operating parameter;

an estimated capacity of the battery at the discharge capacity is determined according to the estimated operating parameter; and a health level of the battery is determined according to the estimated capacity of the battery and a reference capacity, at the discharge capacity, of the battery.

Those skilled in the art will easily figure out other implementation solutions of the examples of the disclosure after considering the specification and practicing the disclosure disclosed herein. The disclosure intends to cover any transformation, application or adaptive change of the examples of the disclosure, which conform to a general principle of the examples of the disclosure and includes common general knowledge or conventional technical means which are not disclosed by the examples in the technical field. The specification and the examples are only regarded as exemplary, the true scope and spirit of the examples of the disclosure are indicated by the following claims.

It should be understood that the examples of the disclosure are not limited to an accurate structure described above and shown in the drawings and accept various combinations, replacements, modifications and changes of the steps of the method or device components disclosed by the present application without departing from their scope, which are constructed as falling within the scope written in the disclosure. The claimed protection scope of the disclosure is limited by the appended claims.

What is claimed is:

1. A method for predicting battery health, applied to a terminal device and comprising:
    obtaining an environment temperature, a discharge capacity and an operating parameter of a battery;
    determining an estimated operating parameter in a preset temperature at the discharge capacity according to the environment temperature, the discharge capacity and the operating parameter; the estimated operating parameter comprises an estimated voltage;
    determining an estimated capacity of the battery according to the estimated operating parameter; and
    determining a health level of the battery according to the estimated capacity of the battery and a reference capacity, at the discharge capacity of the battery.

2. The method for predicting battery health according to claim 1, wherein the operating parameter comprises a first battery voltage; and
    determining the estimated operating parameter in the preset temperature at the discharge capacity according to the environment temperature, the discharge capacity and the operating parameter comprises:
    determining whether the environment temperature is the same as the preset temperature;
    in response to determining the environment temperature being different from the preset temperature, determining a first resistance of the battery in the environment temperature and a second resistance of the battery in the preset temperature according to the discharge capacity;
    determining a first battery current according to the first battery voltage and the first resistance; and
    determining a first estimated voltage in the preset temperature according to the first battery current and the second resistance.

3. The method for predicting battery health according to claim 2, wherein in response to determining the environment temperature is the same as the preset temperature, the first estimated voltage is determined to be equal to the first battery voltage.

4. The method for predicting battery health according to claim 2, wherein determining the estimated capacity of the battery according to the estimated operating parameter comprises:
    determining a first estimated capacity of the battery according to the first estimated voltage and a reference voltage in a set temperature.

5. The method for predicting battery health according to claim 4, wherein determining the first estimated capacity of the battery according to the first estimated voltage and the reference voltage in the set temperature comprises:
    making a ratio of the first estimated voltage to the reference voltage in the set temperature be in positive correlation with a ratio of the first estimated capacity of the battery to the reference capacity of the battery.

6. The method for predicting battery health according to claim 1, wherein the operating parameter includes a second battery voltage; and
    determining the estimated operating parameter in the preset temperature at the discharge capacity according to the environment temperature, the discharge capacity and the operating parameter comprises:
    determining whether the environment temperature is the same as the preset temperature;
    in response to determining the environment temperature being different from the preset temperature, determining whether the battery is in a preset operating state;
    in response to determining the battery is not in the preset operating state, determining a third resistance of the battery in the environment temperature and a fourth resistance of the battery in the preset temperature according to the discharge capacity;
    determining a second battery current according to the third resistance and the second battery voltage;
    determining a second estimated voltage in the environment temperature according to the second battery current and the fourth resistance;
    determining a third battery current according to the second estimated voltage and the fourth resistance; and
    determining a third estimated voltage in the preset operating state in the preset temperature according to the third battery current, the fourth resistance and a reference current in the preset operating state.

7. The method for predicting battery health according to claim 6, wherein in response to determining the environment temperature is the same as the preset temperature, the second estimated voltage is determined to be equal to the second battery voltage.

8. The method for predicting battery health according to claim 6, wherein determining the estimated capacity of the battery according to the estimated operating parameter comprises:
    determining a second estimated capacity of the battery according to the third estimated voltage and the reference voltage in the preset operating state in the set temperature.

9. The method for predicting battery health according to claim 8, wherein determining second estimated capacity of the battery according to the third estimated voltage and the reference voltage in the preset operating state in the set temperature comprises:
    making a ratio of the third estimated voltage to the reference voltage in the preset operating state in the set temperature be in positive correlation with a ratio of the second estimated capacity of the battery to the reference capacity of the battery.

10. The method for predicting battery health according to claim 1, wherein determining the estimated capacity of the battery according to the estimated operating parameter comprises:
measuring a resistance of the battery according to the discharge capacity and the environment temperature, and determining a correspondence between the resistance and the discharge capacity of the battery and the environment temperature.

11. The method for predicting battery health according to claim 1, wherein determining the health level of the battery according to the estimated capacity of the battery and the reference capacity, at the discharge capacity, of the battery comprises:
obtaining service time of the battery, and determining the health level of the battery according to its service time, its estimated capacity and its reference capacity at the discharge capacity.

12. The method for predicting battery health according to claim 1, further comprising:
generating display information for the terminal device to display the determined health level of the battery.

13. An apparatus for determining battery health, comprising:
a processor; and
a memory, configured to store an instruction executable by the processor; wherein
the processor is configured to:
obtain an environment temperature, and a discharge capacity and an operating parameter of a battery;
determine an estimated operating parameter in a preset temperature at the discharge capacity according to the environment temperature, the discharge capacity and the operating parameter; the estimated operating parameter comprises an estimated voltage;
determine an estimated capacity of the battery according to the estimated operating parameter; and
determine a health level of the battery according to the estimated capacity of the battery and a reference capacity, at the discharge capacity of the battery.

14. The prediction apparatus according to claim 13, wherein the operating parameter includes a first battery voltage; and
the processor is configured to:
determine whether the environment temperature is the same as the preset temperature;
in response to determining the environment temperature is different from the preset temperature, determine a first resistance of the battery in the environment temperature and a second resistance of the battery in the preset temperature according to the discharge capacity;
determine a first battery current according to the first battery voltage and the first resistance; and
determine a first estimated voltage in the preset temperature according to the first battery current and the second resistance.

15. The prediction apparatus according to claim 14, wherein in response to determining the environment temperature is the same as the preset temperature, the first estimated voltage is determined to be equal to the first battery voltage.

16. The prediction apparatus according to claim 14, the processor is configured to:
determine a first estimated capacity of the battery according to the first estimated voltage and a reference voltage in a set temperature.

17. The prediction apparatus according to claim 16, the processor is configured to:
make a ratio of the first estimated voltage to the reference voltage in the set temperature be in positive correlation with a ratio of the first estimated capacity of the battery to the reference capacity of the battery.

18. The prediction apparatus according to claim 13, wherein the operating parameter includes a second battery voltage; and
the processor is configured to:
determine whether the environment temperature is the same as the preset temperature;
in response to determining the environment temperature is different from the preset temperature, determining whether the battery is in a preset operating state;
in response to determining the battery is not in the preset operating state, determine a third resistance of the battery in the environment temperature and a fourth resistance of the battery in the preset temperature according to the discharge capacity;
determine a second battery current according to the third resistance and the second battery voltage;
determine a second estimated voltage in the set temperature according to the second battery current and the fourth resistance;
determine a third battery current according to the second estimated voltage and the fourth resistance; and
determine a third estimated voltage in the preset operating state in the preset temperature according to the third battery current, the fourth resistance and a reference current in the preset operating state.

19. The prediction apparatus according to claim 18, wherein in response to determining the environment temperature is the same as the preset temperature, the second estimated voltage is determined to be equal to the second battery voltage.

20. A non-temporary computer readable storage medium, wherein the computer readable storage medium stores an instruction, when the instruction is called and executed on a computer to:
obtain an environment temperature, and a discharge capacity and an operating parameter of a battery;
determine an estimated operating parameter in a preset temperature at the discharge capacity according to the environment temperature, the discharge capacity and the operating parameter; the estimated operating parameter comprises an estimated voltage;
determine an estimated capacity of the battery according to the estimated operating parameter; and
determine a health level of the battery according to the estimated capacity of the battery and a reference capacity, at the discharge capacity of the battery.

* * * * *

UNITED STATES PATENT AND TRADEMARK OFFICE
CERTIFICATE OF CORRECTION

PATENT NO. : 11,686,776 B2
APPLICATION NO. : 17/564675
DATED : June 27, 2023
INVENTOR(S) : Yaoyi Tseng It is certified that error appears in the above-identified patent and that said Letters Patent is hereby corrected as shown below:

On the Title Page

In Item (56), under "OTHER PUBLICATIONS", in Column 2, Line 3, delete "Andmeasurement," and insert -- And measurement, --, therefor.
In Item (56), under "OTHER PUBLICATIONS", in Column 2, Line 4, delete "(Jun. 1, 2011),pp." and insert -- (Jun. 1, 2011), pp. --, therefor.
On Page 2, in Item (56), under "OTHER PUBLICATIONS", in Column 1, Line 3, delete "Method" ,IEEE" and insert -- Method", IEEE --, therefor.
On Page 2, in Item (56), under "OTHER PUBLICATIONS", in Column 1, Line 3, delete "Electronics,Institute" and insert -- Electronics, Institute --, therefor.
On Page 2, in Item (56), under "OTHER PUBLICATIONS", in Column 1, Line 4, delete "Electronicsengineers," and insert -- Electronics Engineers, --, therefor.
On Page 2, in Item (56), under "OTHER PUBLICATIONS", in Column 1, Line 4, delete "No. 6,Oct. 23," and insert -- No. 6, Oct. 23, --, therefor.

In the Drawings

In Fig. 4, Vset has been replaced with $V_{set}$. (As shown on the attached drawing sheet)
In Fig. 4, V0 has been replaced with $V_0$. (As shown on the attached drawing sheet)
In Fig. 6, V″set has been replaced with $V''_{set}$. (As shown on the attached drawing sheet)
In Fig. 6, V′set has been replaced with $V'_{set}$. (As shown on the attached drawing sheet)
In Fig. 6, V′ 0 has been replaced with $V'_0$. (As shown on the attached drawing sheet)

In the Specification

In Column 3, Line 64, delete "predication" and insert -- prediction --, therefor.
In Column 4, Line 59, delete "show" and insert -- shown --, therefor.
In Column 8, Line 15, delete "(a)." and insert -- ($\Omega$). --, therefor.
In Column 9, Line 4, delete "roof" and insert -- $I'_0$ of --, therefor.
In Column 9, Line 19, delete "mAh" and insert -- mAh) --, therefor.

Signed and Sealed this
Seventh Day of November, 2023

Katherine Kelly Vidal
*Director of the United States Patent and Trademark Office*

In Column 9, Line 20, delete "different" and insert -- difference --, therefor.
In Column 11, Line 67, delete "for of" and insert -- for --, therefor.
In Column 16, Line 36, delete "infra-red" and insert -- infrared --, therefor.

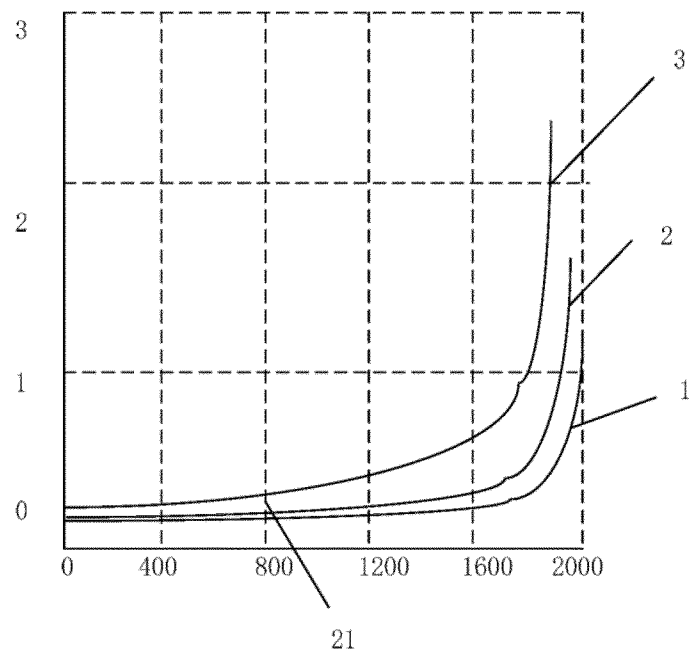
FIG. 3
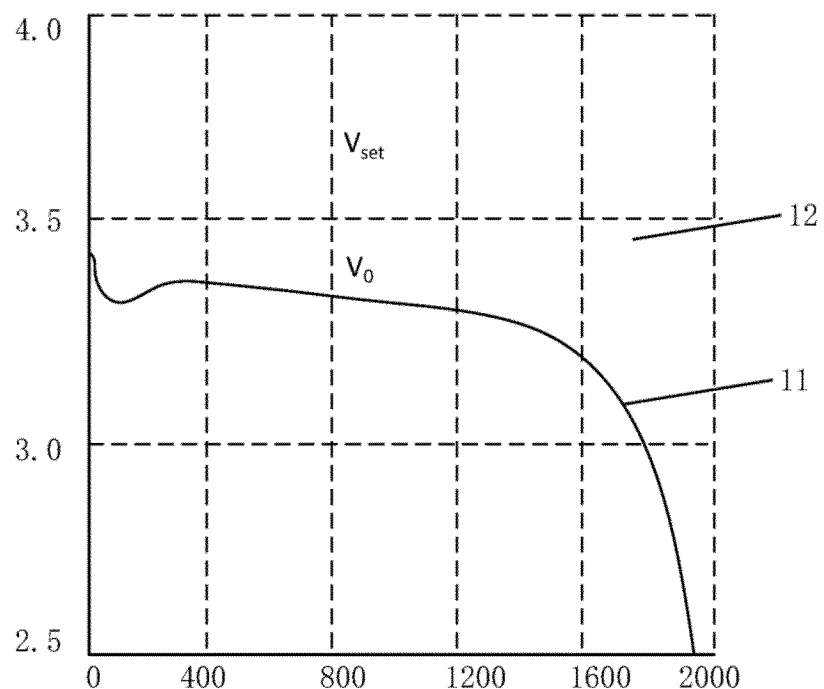
FIG. 4

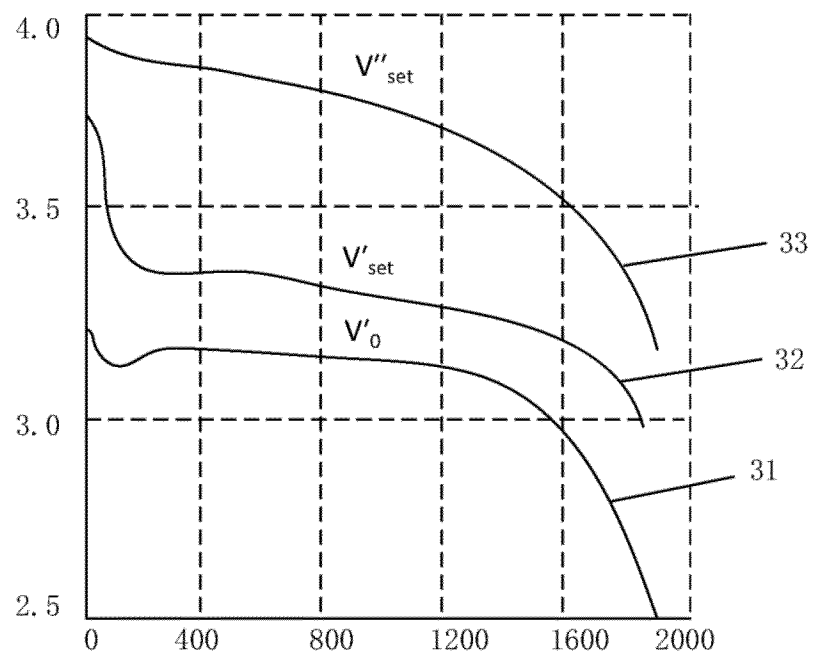
FIG. 6
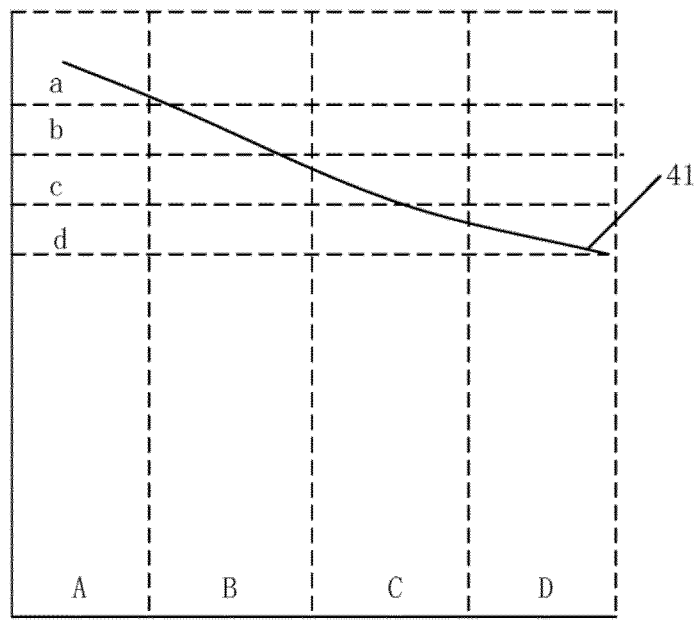
FIG. 7